(12) United States Patent
Yu

(10) Patent No.: US 6,368,982 B1
(45) Date of Patent: Apr. 9, 2002

(54) PATTERN REDUCTION BY TRIMMING A PLURALITY OF LAYERS OF DIFFERENT HANDMASK MATERIALS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 09/713,391

(22) Filed: Nov. 15, 2000

(51) Int. Cl.[7] .............................................. H01L 21/00
(52) U.S. Cl. ........................... 438/753; 216/51; 216/99; 438/725; 438/738; 438/745; 438/756; 438/757
(58) Field of Search ................................. 438/717, 719, 438/723, 724, 725, 736, 738, 743, 744, 745, 753, 756, 757; 216/2, 41, 47, 49, 51, 67, 99, 79

(56) References Cited

U.S. PATENT DOCUMENTS

| | | | | |
|---|---|---|---|---|
| 6,127,070 A | * | 10/2000 | Yang et al. | 438/725 X |
| 6,191,046 B1 | * | 2/2001 | Singh et al. | 438/725 X |
| 6,200,907 B1 | * | 3/2001 | Wang et al. | 438/725 X |

* cited by examiner

Primary Examiner—William A. Powell
(74) Attorney, Agent, or Firm—Monica H. Choi

(57) ABSTRACT

In a method for patterning a target material on a semiconductor substrate, a first hardmask material is deposited on the target material and a second hardmask material is deposited on the first hardmask material. The first hardmask material is different from the target material, and the second hardmask material is different from the first hardmask material. A patterned structure of a patterning material such a photoresist material is formed on the second hardmask material. Any exposed region of the second hardmask material is etched such that a second hardmask structure is formed from the second hardmask material remaining under the patterned structure. The etching reactant for etching the second hardmask material to form the second hardmask structure substantially does not etch the first hardmask material. The second hardmask structure is trimmed to reduce the length at each side of the second hardmask structure. Any exposed region of the first hardmask material is etched using a second etching reactant such that a first hardmask structure is formed from the first hardmask material remaining under the second hardmask structure. The second etching reactant substantially does not etch the second hardmask structure and the target material. The first hardmask structure is trimmed with a second trimming reactant to reduce the length at each side of first second hardmask structure. Any exposed region of the target material is etched using a third etching reactant such that a target structure is formed from the target material remaining under the first hardmask structure.

14 Claims, 5 Drawing Sheets

PATTERN REDUCTION BY TRIMMING A PLURALITY OF LAYERS OF DIFFERENT HANDMASK MATERIALS

TECHNICAL FIELD

The present invention relates generally to fabrication of integrated circuits, and more particularly, to a method for reducing dimensions beyond photolithography limitations during a patterning process by selectively patterning and trimming each of a plurality of layers of different hardmask materials in a successive sequence.

BACKGROUND OF THE INVENTION

Referring to FIG. 1, for fabrication of an integrated circuit structure, a layer of target material 102 is deposited on a semiconductor substrate 104. For example, for formation of a gate of a MOSFET (Metal Oxide Semiconductor Field Effect Transistor), the layer of target material 102 may be comprised of polysilicon. For patterning and etching the layer of target material 102 to form the integrated circuit structure, a photoresist structure 106 has been patterned and etched from a layer of photoresist material in a photolithography process as known to one of ordinary skill in the art of integrated circuit fabrication. The photoresist structure 106 has a length 108 and a height 110.

Referring to FIGS. 1 and 2, any exposed region of the layer of target material 102 is etched away to form a target structure 112 of the target material remaining under the photoresist structure 106. Thus, the target structure 112 has the same length 108 as that of the photoresist structure 106.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

In FIGS. 1 and 2, to scale down the length of the target structure 112, the length 108 of the photoresist structure 106 is scaled down during the photolithography process for forming the photoresist structure 106. However, photolithography processes for forming the photoresist structure 106 have limitations for a minimum length, as known to one of ordinary skill in the art of integrated circuit fabrication. Nevertheless, dimensions that are smaller than the minimum length achievable with photolithography process limitations are desired as integrated circuit devices are scaled down further.

Referring to FIGS. 1 and 3, for achieving such smaller dimensions than achievable with photolithography process limitations, after the photoresist structure 106 is formed to the minimum length possible given photolithography process limitations, the photoresist structure 106 is trimmed to reduce the original length 108 of the photoresist structure 106 by a trim length 114 using a photoresist trimming process as known to one of ordinary skill in the art of integrated circuit fabrication. During such a photoresist trimming process, the dimensions of the photoresist structure 106 are reduced by the trim length 114 at the two sides and at the top of the photoresist structure 106 as illustrated in FIG. 3. In this manner, the target structure formed from etching away any exposed region of layer of the target material 102 has the scaled down length of the photoresist structure 106 of FIG. 3.

During the photoresist trimming process, the two sides and the top of the photoresist structure 106 are trimmed by the substantially same trim length 114. Thus, with the photoresist trimming process of the prior art, the minimum length of the photoresist structure 106 is limited by the height 110 of the photoresist layer forming the original photoresist structure 106.

Furthermore, referring to FIG. 4, even if the photoresist structure 106 having a small length were formed with a relatively thick photoresist layer, the aspect ratio (defined as the height to the length) of the photoresist structure 106 is high. Because photoresist material is a malleable material as known to one of ordinary skill in the art of integrated circuit fabrication, the photoresist structure 106 having high aspect ratio is likely to deform in shape by bending over.

Referring to FIG. 5, a hardmask structure 116 having a length 118 and comprised of a hardmask material (such as silicon nitride for example) that is not as malleable as photoresist material may be formed to pattern the layer of target material 102. The dimensions of the hardmask structure 116 may be further scaled down in a hardmask trimming process as known to one of ordinary skill in the art of integrated circuit fabrication. However, because the dimensions of the hardmask structure 116 would be trimmed at both the side surfaces and the top surface of the hardmask structure 116 during the hardmask trimming process, the minimum length of the hardmask structure 116 is limited by the original height of the hardmask structure 116, similar to the photoresist structure 106.

Furthermore, referring to FIG. 5, when the hardmask structure 116 is comprised of a dielectric material (such as silicon nitride for example), having a large height for a large trim length, the top corners of the hardmask structure 116 become rounded during the hardmask trimming process to form the hardmask structure 116, as known to one of ordinary skill in the art of integrated circuit fabrication. With such rounded top corners of the hardmask structure 116, the thickness of the hardmask structure 116 tapers to be smaller at the sides of the hardmask structure 116 down toward the layer of target material 102. Referring to FIGS. 5 and 6, during etching of the target material 102 to form the target structure 112, the portion of the hardmask structure 116 having the smaller thickness at the sides of the hardmask structure 116 down toward the layer of target material 102 may etch away to result in an undesired smaller length 120 of the hardmask structure 116 and the target structure 112. Thus, the length of the target structure 112 is more difficult to predict and control when using the single hardmask structure 116.

Despite such disadvantages of trimming the single photoresist structure 106 of the prior art (as illustrated in FIGS. 1, 2, 3, and 4) or the single hardmask structure 116 of the prior art (as illustrated in FIGS. 5 and 6), the dimensions of the target structure are desired to be further scaled down.

Thus, a mechanism is desired for scaling down the dimensions of the target structure beyond photolithography process limitations without the disadvantages of trimming the single photoresist structure 106 of the prior art or the single hardmask structure 116 of the prior art.

SUMMARY OF THE INVENTION

Accordingly, in a general aspect of the present invention, a plurality of layers of different hardmask materials having relatively small thickness are selectively patterned and trimmed in a successive sequence to achieve dimensions beyond photolithography process limitations.

In one embodiment of the present invention, in a method for patterning a layer of target material on a semiconductor substrate, the method includes a step of depositing a layer of first hardmask material on the layer of target material. The first hardmask material is different from the target material. A layer of second hardmask material is deposited on the layer of first hardmask material, and the second hardmask material is different from the first hardmask material. A layer of patterning material is deposited on the layer of second hardmask material. The layer of patterning material is patterned and etched such that a patterned structure of the patterning material remains on the second layer of second hardmask material.

Any exposed region of the layer of second hardmask material is etched using a first etching reactant such that a second hardmask structure is formed from the second hardmask material remaining under the patterned structure and on the layer of first hardmask material. The first etching reactant substantially does not etch the layer of first hardmask material, and the second hardmask structure has a second mask length. The patterned structure is then removed from the second hardmask structure.

The second hardmask structure is trimmed with a first trimming reactant in a hardmask trimming process to reduce the second mask length by a second trim length at each side of the second hardmask structure. The first trimming reactant substantially does not etch the layer of first hardmask material.

Any exposed region of the layer of first hardmask material is etched using a second etching reactant such that a first hardmask structure is formed from the first hardmask material remaining under the second hardmask structure and on the layer of target material. The second etching reactant substantially does not etch the second hardmask material and the target material, and the first hardmask structure has a first mask length. The second hark mask structure is then removed from the first hardmask structure.

The first hardmask structure is trimmed with a second trimming reactant in a hardmask trimming process to reduce the first mask length by a first trim length at each side of first second hardmask structure. The second trimming reactant substantially does not etch the target material. Any exposed region of the target material is etched using a third etching reactant such that a target structure is formed from the target material remaining under the first hardmask structure. The third etching reactant substantially does not etch the first hardmask material. The first hardmask structure is then removed from the target structure.

The present invention may be used to particular advantage when the layer of first hardmask material and the layer of second hardmask material have a relatively small thickness is a range of from about 100 Å to about 250 Å to prevent rounding of the top corners of the first hardmask structure and the second hardmask structure.

In this manner, because a plurality of layers of different hardmask materials are selectively patterned and trimmed in a successive sequence, each of the layers of different hardmask materials may have relatively small thickness to prevent rounding of the top corners of the hardmask structures formed with patterning of each of the hardmask materials. In addition, the length dimension of the target structure is further scaled down with patterning and trimming of each of the plurality of layers of different hardmask as materials.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

Figure 1:
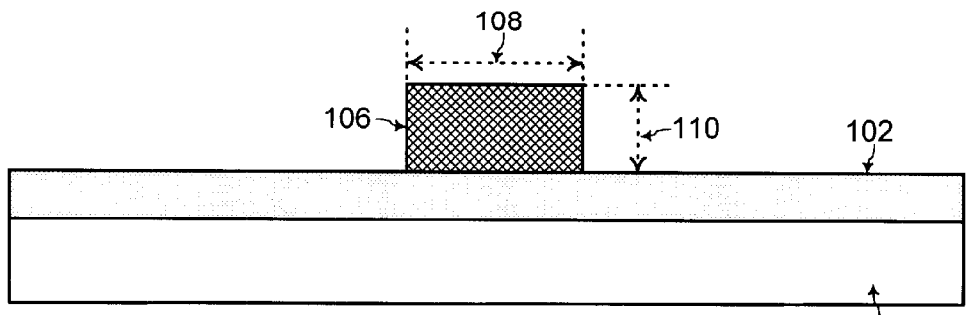
FIG. 1 shows a cross-sectional view of a photoresist structure formed on a layer of target material, according to the prior art.
Figure 2:
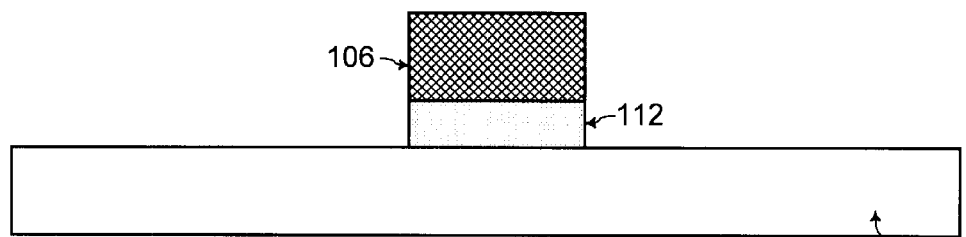
FIG. 2 shows the layer of target material patterned by the photoresist structure of FIG. 1 to form a target structure, according to the prior art.
Figure 3:
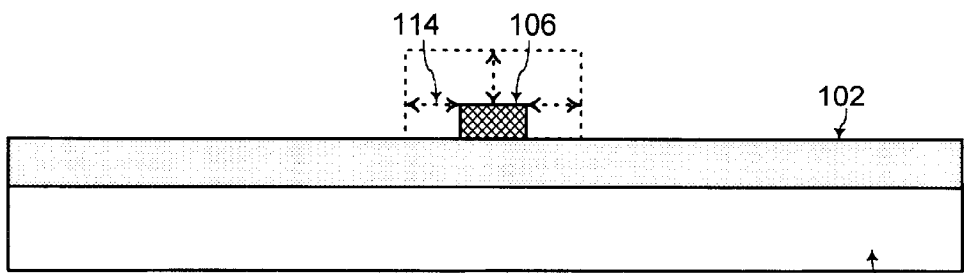
FIG. 3 shows the dimensions of the single photoresist structure of FIG. 1 scaled down in a photoresist trimming process to achieve a smaller length of the target structure, according to the prior art.
Figure 4:
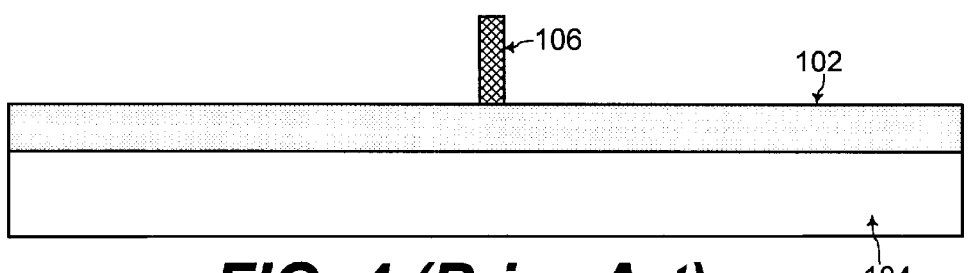
FIG. 4 shows an example photoresist structure having a high aspect ratio and formed from a photoresist layer having a relatively high thickness, according to the prior art.
Figure 5:
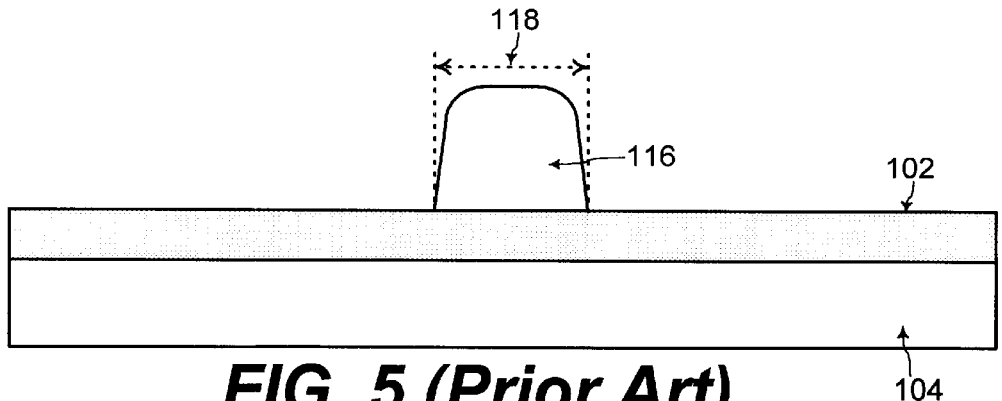
FIG. 5 shows an example hardmask structure used instead of the photoresist structure of FIG. 1 for patterning the layer of target material with the hardmask structure having rounded top corners, according to the prior art.
Figure 6:
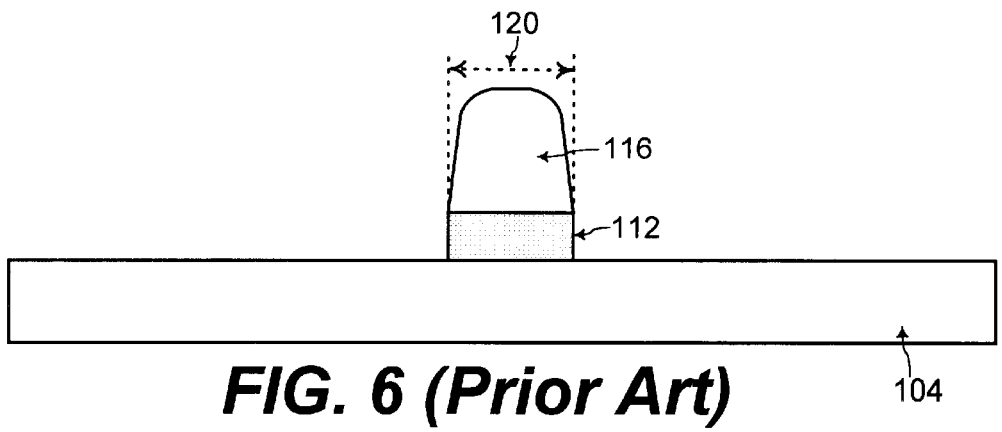
FIG. 6 shows patterning of the layer of target material with the hardmask structure of FIG. 5 to form the target structure having an undesired smaller length that may result because of the rounded top corners of the hardmask structure of FIG. 5, according to the prior art.
Figure 7:
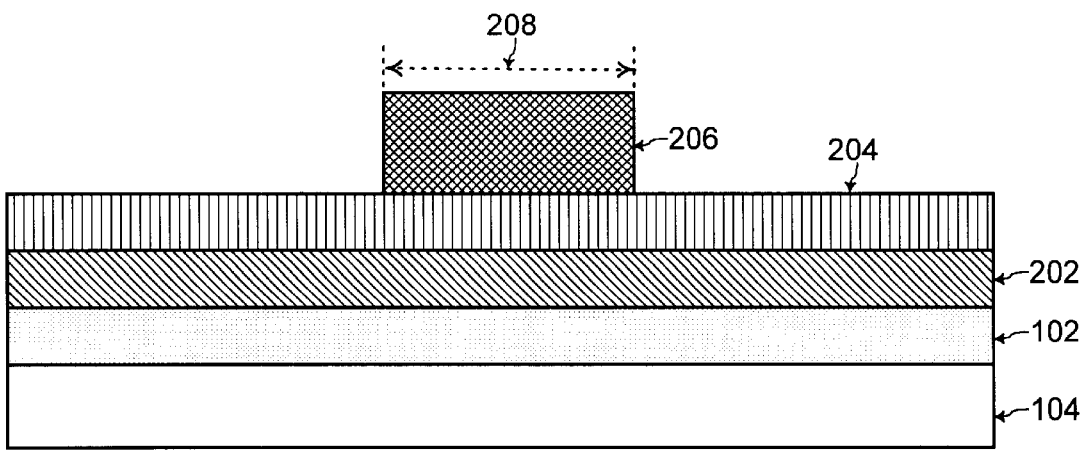
FIGS. 7, 8, 9, 10, 11, 12, 13, 14, 15, and 16 show cross-sectional views for illustrating the steps for selectively patterning and trimming a plurality of layers of different hardmask materials in a successive sequence such that the length dimension of the target structure may be further scaled down with patterning and trimming of each of the plurality of layers of different hardmask materials, according to an embodiment of the present invention.

Referring to FIG. 7, for patterning the layer of target material 102 on the semiconductor substrate 104, a layer of first hardmask material 202 is deposited on the layer of target material 102, and a layer of second hardmask material 204 is deposited on the layer of first hardmask material 202. An embodiment of the present invention is described for the example materials of the layer of target material being comprised of polysilicon, the layer of first hardmask material 202 being comprised of silicon nitride ($Si_3N_4$), and the layer of second hardmask material 204 being comprised of silicon dioxide ($SiO_2$).

The present invention may also be practiced when the layer of first hardmask material 202 and the layer of second hardmask material 204 are comprised of any other types of hardmask materials such as any one of polysilicon, amorphous silicon, silicon dioxide, silicon nitride, or silicon oxynitride, for example. However, according to the general invention, the first hardmask material 202 is different from the adjoining target material 102 such that the first hardmask material 202 etches with a different etch rate than that of the target material 102. In addition, the second hardmask material 204 is different from the adjoining first hardmask material 202 such that the second hardmask material 204 etches with a different etch rate than that of the first hardmask material 202.

Further referring to FIG. 7, for forming a target structure from the layer of target material 102, a layer of patterning material such as photoresist material is deposited on the layer of second hardmask material 204 and is patterned and etched to form a patterned structure 206. The patterned structure 206 is comprised of the patterning material such a photoresist material that remains on the second layer of hardmask material 204 and has a patterned length 208. Photolithography processes for patterning and etching the photoresist material to form the patterned structure 206 are known to one of ordinary skill in the art of integrated circuit fabrication. In one embodiment of the present invention, the patterned length 208 of the patterned structure 206 is the minimum length possible given photolithography process limitations as known to one of ordinary skill in the art of integrated circuit fabrication.

Figure 8:
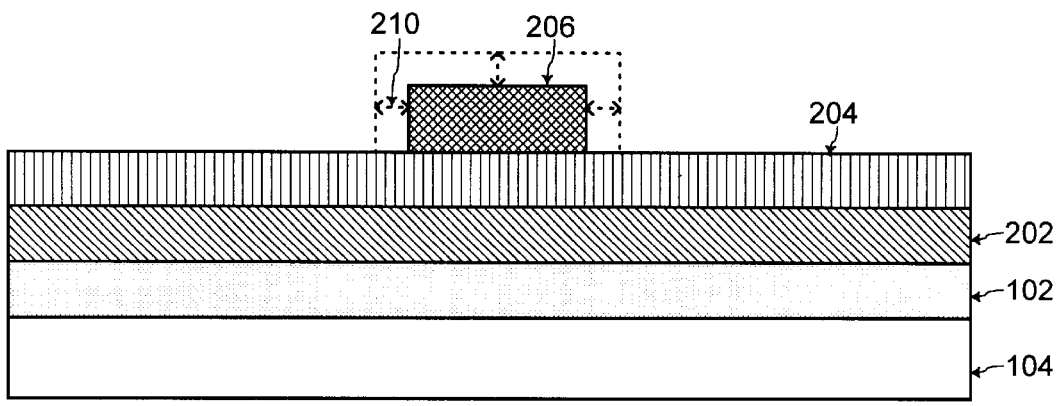

Referring to FIGS. 7 and 8, in one embodiment of the present invention, the photoresist structure 206 is trimmed in a photoresist trimming process to scale down the dimensions of the photoresist structure 206 by a trim length 210 at the two sides and the top of the photoresist structure 206. Photoresist trimming processes which scale down the dimensions of the photoresist structure 206 by a controlled trim length are known to one of ordinary skill in the art of integrated circuit fabrication. In an alternative embodiment of the present invention, the patterned structure 206 may not be trimmed in a photoresist trimming process. The present invention may be practiced with or without trimming the patterned structure 206.

Figure 9:
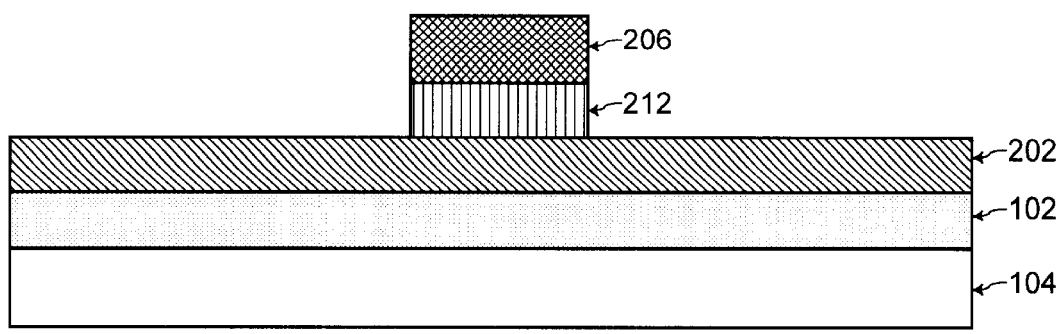

Referring to FIGS. 8 and 9, any exposed region of the layer of second hardmask material 204 is etched using a first etching reactant such that a second hardmask structure 212 is formed from the second hardmask material remaining under the patterned structure 206 and on the layer of first hardmask material 202. The layer second hardmask material 204 has a substantially faster etch rate in the first etching reactant than the etch rate of the layer of first hardmask material 202 in the first etching reactant. Thus, the first etching reactant substantially does not etch the layer of first hardmask material 202 during etching of the second hardmask material for forming the second hardmask structure 212. For example, when the layer of first hardmask material 202 is comprised of silicon nitride ($Si_3N_4$) and the layer of second hardmask material 204 is comprised of silicon dioxide ($SiO_2$), the first etching reactant is comprised of hydrofluoric acid (HF). Such selective etching processes are known to one of ordinary skill in the art of integrated circuit fabrication.

Figure 10:
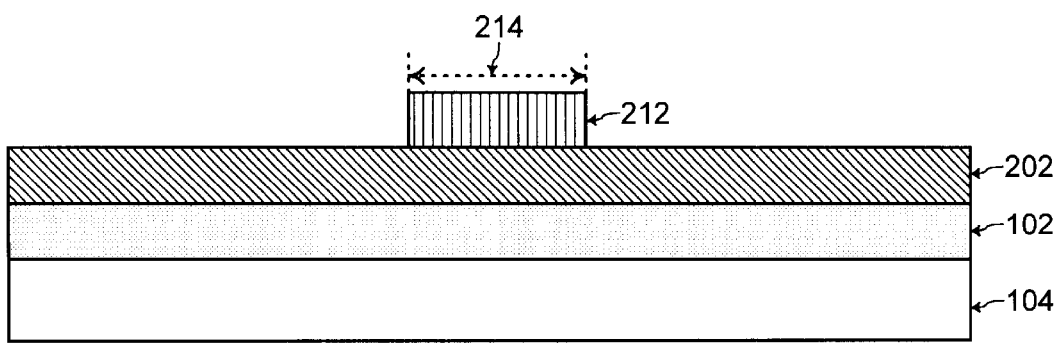

Referring to FIGS. 9 and 10, the patterned structure 206 is removed from the second hardmask structure 212. Processes for removing the patterned structure 206 comprised of patterning material such as photoresist material for example are known to one of ordinary skill in the art of integrated circuit fabrication. Referring to FIG. 10, the second hardmask structure 212 initially has a second mask length 214.

Figure 11:
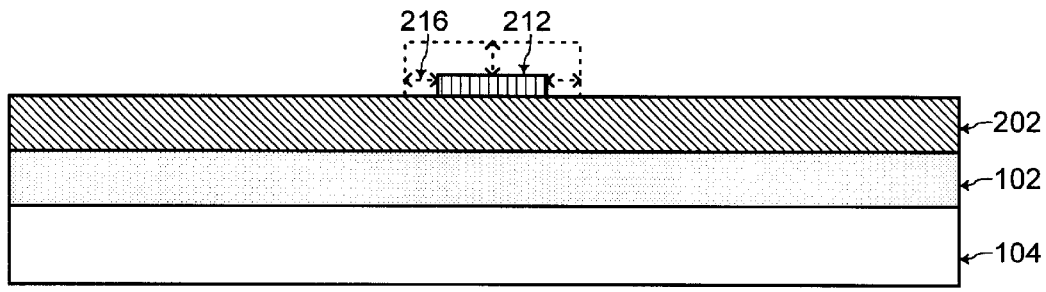

Referring to FIG. 11, the second hardmask structure 212 is trimmed with a first trimming reactant in a hardmask trimming process to scale down the dimensions of the second hardmask structure 212 by a trim length 216 at the two sides and the top of the second hardmask structure 212. Hardmask trimming processes which scale down the dimensions of the second hardmask structure 212 by a controlled trim length are known to one of ordinary skill in the art of integrated circuit fabrication.

According to a general aspect of the present invention, the first trimming reactant used in the hardmask trimming process for trimming the second hardmask structure 212 substantially does not etch the layer of first hardmask material 202. For example, when the layer of first hardmask material 202 is comprised of silicon nitride ($Si_3N_4$) and the layer of second hardmask material 204 is comprised of silicon dioxide ($SiO_2$), the first trimming reactant is comprised of dicarbon hexafluoride ($C_2F_6$) for example. Such selective hardmask trimming processes are known to one of ordinary skill in the art of integrated circuit fabrication.

Figure 12:
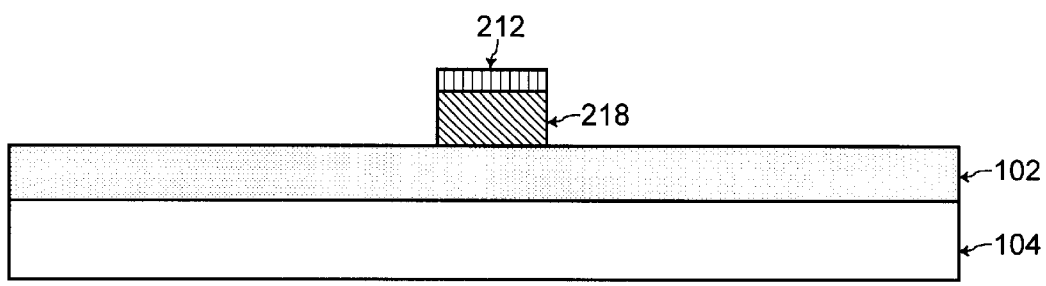

Referring to FIGS. 11 and 12, any exposed region of the layer of first hardmask material 202 is etched using a second etching reactant such that a first hardmask structure 218 is formed from the first hardmask material remaining under the second hardmask structure 212 and on the layer of target material 102. The layer of first hardmask material 202 has a substantially faster etch rate in the second etching reactant than the etch rate of the layer of target material 102 and the second hardmask structure 212 in the second etching reactant. Thus, the second etching reactant substantially does not etch the layer of target material 102 and the second hardmask structure 212 during etching of the first hardmask material for forming the first hardmask structure 218. For example, when the layer of first hardmask material 202 is comprised of silicon nitride ($Si_3N_4$), the second hardmask structure 212 is comprised of silicon dioxide ($SiO_2$), and the layer of target material 102 is comprised of polysilicon, the second etching reactant is comprised of phosphoric acid ($H_3PO_4$). Such selective etching processes are known to one of ordinary skill in the art of integrated circuit fabrication.

Figure 13:
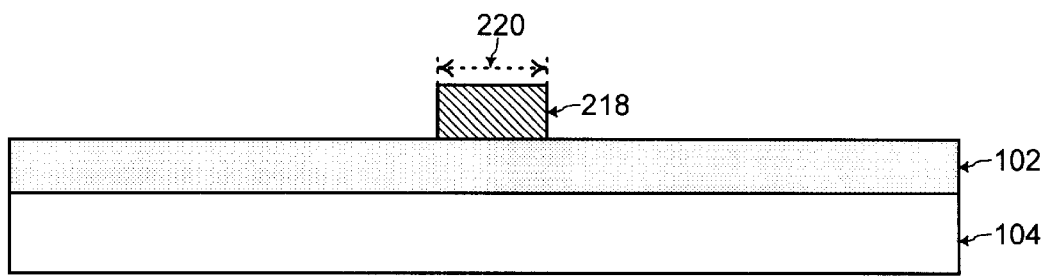

Referring to FIGS. 12 and 13, the second hardmask structure 212 is removed from the first hardmask structure 218. Processes for selectively removing the second hardmask structure 212 which is comprised of a different hardmask material from that of the first hardmask structure 218 are known to one of ordinary skill in the art of integrated circuit fabrication. Referring to FIG. 13, the first hardmask structure 218 initially has a first mask length 220.

Figure 14:
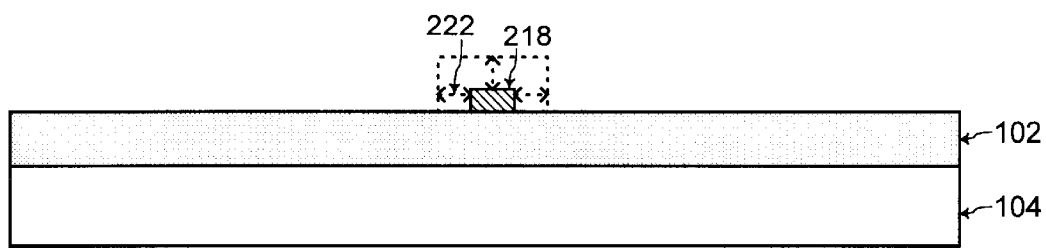

Referring to FIG. 14, the first hardmask structure 218 is trimmed with a second trimming reactant in a hardmask trimming process to scale down the dimensions of the first hardmask structure 218 by a trim length 222 at the two sides and the top of the first hardmask structure 218. Hardmask trimming processes which scale down the dimensions of the first hardmask structure 218 by a controlled trim length are known to one of ordinary skill in the art of integrated circuit fabrication.

According to a general aspect of the present invention, the second trimming reactant used in the hardmask trimming process for trimming the first hardmask structure 218 substantially does not etch the layer of target material 102. For example, when the layer of target material 102 is comprised of polysilicon and the first hardmask structure 218 is comprised of silicon nitride ($Si_3N_4$), the second trimming reactant is comprised of argon (Ar) for example. Such selective hardmask trimming processes are known to one of ordinary skill in the art of integrated circuit fabrication.

Figure 15:
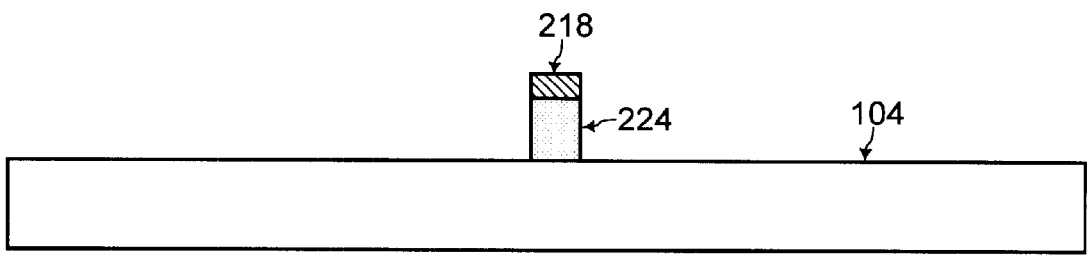

Referring to FIGS. 14 and 15, any exposed region of the layer of target material 102 is etched using a third etching reactant such that a target structure 224 is formed from the target material remaining under the first hardmask structure 218. The layer of target material 102 has a substantially faster etch rate in the third etching reactant than the etch rate of the first hardmask structure 218 in the third etching reactant. Thus, the third etching reactant substantially does not etch the first hardmask structure 218 during etching of the target material for forming the target structure 224. For example, when the layer of target material 102 is comprised of polysilicon and the first hardmask structure 218 is comprised of silicon nitride (Si$_3$N$_4$), the third etching reactant is comprised of hydrofluoric acid (HF). Such selective etching processes are known to one of ordinary skill in the art of integrated circuit fabrication.

Figure 16:
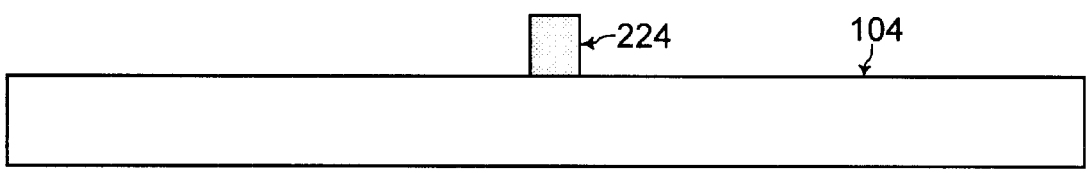

Referring to FIGS. 15 and 16, the first hardmask structure 218 is removed from the target structure 224. Processes for selectively removing the first hardmask structure 218 which is comprised of a different material from that of the target structure 224 are known to one of ordinary skill in the art of integrated circuit fabrication. The target structure 224 is the integrated circuit structure for fabrication of an integrated circuit. For example, when the target structure 224 is comprised of polysilicon, the target structure 224 may be the gate electrode of a MOSFET (Metal Oxide Semiconductor Field Effect Transistor).

In this manner, because a plurality of layers of different hardmask materials are selectively patterned and trimmed in a successive sequence, each of the layers of different hardmask materials may have relatively small thickness to prevent rounding of the top corners of the hardmask structures formed with patterning of each of the hardmask materials. For example, the layer of first hardmask material 202 and the layer of second hardmask material 204 each have a thickness that is less than about 500 Å (angstroms), and in a range of from about 100 Å to about 250 Å, according to a preferred embodiment of the present invention. In addition, the length dimension of the target structure is further scaled down with patterning and trimming of each of the plurality of layers of different hardmask materials. Thus, dimensions of the target structure may be scaled down beyond those possible with photolithography process limitations.

The foregoing is by way of example only and is not intended to be limiting. For example, an embodiment of the present invention is described for the example materials of the layer of target material being comprised of polysilicon, the layer of first hardmask material 202 being comprised of silicon nitride (Si$_3$N$_4$), and the layer of second hardmask material 204 being comprised of silicon dioxide (SiO$_2$). However, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sides," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for patterning a layer of target material on a semiconductor substrate, the method including the steps of:
   A. depositing a layer of first hardmask material on said layer of target material, wherein said first hardmask material is different from said target material;
   B. depositing a layer of second hardmask material on said layer of first hardmask material, wherein said second hardmask material is different from said first hardmask material;
   C. depositing a layer of patterning material on said layer of second hardmask material;
   D. patterning and etching said layer of patterning material such that a patterned structure of said patterning material remains on said second layer of it second hardmask material, said patterned structure having a patterned length;
   E. etching any exposed region of said layer of second hardmask material using a first etching reactant such that a second hardmask structure is formed from said second hardmask material remaining under said patterned structure and on said layer of first hardmask material, wherein said first etching reactant substantially does not etch said layer of first hardmask material, and wherein said second hardmask structure has a second mask length;
   F. removing said patterned structure from said second hardmask structure;
   G. trimming said second hardmask structure with a first trimming reactant to reduce said second mask length by a second trim length at each side of said second hardmask structure, wherein said first trimming reactant substantially does not etch said layer of first hardmask material;
   H. etching any exposed region of said layer of first hardmask material using a second etching reactant such that a first hardmask structure is formed from said first hardmask material remaining under said second hardmask structure and on said layer of target material, wherein said second etching reactant substantially does not etch said second hardmask material and said target material, and wherein said first hardmask structure has a first mask length;
   I. removing said second hardmask structure from said first hardmask structure;
   J. trimming said first hardmask structure with a second trimming reactant to reduce said first mask length by a first trim length at each side of first second hardmask structure, wherein said second trimming reactant substantially does not etch said target material;
   K. etching any exposed region of said target material using a third etching reactant such that a target structure is formed from said target material remaining under said first hardmask structure, wherein said third etching reactant substantially does not etch said first hardmask material; and
   L. removing said first hardmask structure from said target structure.

2. The method of claim 1, wherein said first hardmask layer is comprised of one of polysilicon, amorphous silicon, silicon dioxide, silicon nitride, and silicon oxynitride.

3. The method of claim 1, wherein said second hardmask layer is comprised of one of polysilicon, amorphous silicon, silicon dioxide, silicon nitride, and silicon oxynitride.

4. The method of claim 1, wherein said layer of first hardmask material has a thickness less than about 500 Å.

5. The method of claim 4, wherein said layer of first hardmask material has a thickness in a range of from about 100 Å to about 250 Å.

6. The method of claim 1, wherein said layer of second hardmask material has a thickness less than about 500 Å.

7. The method of claim 6, wherein said layer of second hardmask material has a thickness in a range of from about 100 Å to about 250 Å.

8. The method of claim 1, the method further including the step of:
   trimming said patterned structure, before said step E, with a third trimming reactant to reduce said patterned length by a third trim length at each side of said patterned structure, wherein said third trimming reactant substantially does not etch said layer of second hardmask material.

9. The method of claim 1, wherein said patterning material is comprised of photoresist material.

10. The method of claim 1, wherein said first hardmask material is comprised of silicon nitride when said target material is not comprised of silicon nitride, and wherein said second hardmask material is comprised of silicon dioxide.

11. The method of claim 10, wherein said first etching reactant for etching said layer of second hardmask material is comprised of hydrofluoric acid (HF), and wherein said second etching reactant for etching said layer of first hardmask material is comprised of phosphoric acid ($H_3PO_4$).

12. The method of claim 10, wherein said first trimming reactant for trimming said second hardmask structure is comprised of dicarbon hexafluoride ($C_2F_6$), and wherein said second trimming reactant for trimming said first hardmask structure is comprised of argon.

13. The method of claim 10, wherein said target material is comprised of polysilicon.

14. A method for patterning a layer of target material on a semiconductor substrate, the method including the steps of:

A. depositing a layer of first hardmask material on said layer of target material, wherein said first hardmask material is comprised of silicon nitride and wherein said target material is comprised of polysilicon, and wherein said layer of first hardmask material has a thickness in a range of from about 100 Å to about 250 Å;

B. depositing a layer of second hardmask material on said layer of first hardmask material, wherein said second hardmask material is comprised of silicon dioxide, wherein said layer of second hardmask material has a thickness in a range of from about 100 Å to about 250 Å;

C. depositing a layer of patterning material on said layer of second hardmask material, wherein said layer of patterning material is comprised of photoresist material;

D. patterning and etching said layer of patterning material such that a patterned structure of said photoresist material remains on said layer of second hardmask material, said patterned structure having a patterned length;

E. trimming said patterned structure with a photoresist trimming reactant to in reduce said patterned length by a trim length at each side of said patterned structure, wherein said photoresist trimming reactant substantially does not etch said layer of second hardmask material;

F. etching any exposed region of said layer of second hardmask material using a first etching reactant comprised of hydrofluoric acid (EF) such that a second hardmask structure is formed from said second hardmask material remaining under said patterned structure and on said layer of first hardmask material, wherein said first etching reactant substantially does not etch said layer of first hardmask material, and wherein said second hardmask structure has a second mask length;

G. removing said patterned structure from said second hardmask structure;

H. trimming said second hardmask structure with a first trimming reactant comprised of dicarbon hexafluoride ($C_2F_6$) to reduce said second mask length by a second trim length at each side of said second hardmask structure, wherein said first trimming reactant substantially does not etch said layer of first hardmask material;

I. etching any exposed region of said layer of first hardmask material using a second etching reactant comprised of phosphoric acid ($H_3PO_4$) such that a first hardmask structure is formed from said silicon nitride remaining under said second hardmask structure and on said layer of target material, wherein said second etching reactant substantially does not etch silicon oxide of said second hardmask structure and polysilicon of said layer of target material, and wherein said first hardmask structure has a first mask length;

J. removing said second hardmask structure from said first hardmask structure;

K. trimming said first hardmask structure with a second trimming reactant comprised of argon to reduce said first mask length by a first trim length at each side of first second hardmask structure, wherein said second trimming reactant substantially does not etch said target material;

L. etching any exposed region of said layer of target material using a third etching reactant comprised of hydrofluoric acid such that a target structure is formed from said target material remaining under said first hardmask structure, wherein said third etching reactant substantially does not etch said first hardmask material; and M. removing said first hardmask structure from said target structure.

* * * * *